United States Patent
Cheng et al.

(10) Patent No.: US 6,344,157 B1
(45) Date of Patent: Feb. 5, 2002

(54) CONDUCTIVE AND RESISTIVE MATERIALS WITH ELECTRICAL STABILITY FOR USE IN ELECTRONICS DEVICES

(75) Inventors: Chih-Min Cheng, Lowell; Gerald Fredrickson, Westford, both of MA (US); Yue Xiao; Quinn K. Tong, both of Belle Mead, NJ (US); Daoqiang Lu, Allentown, PA (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 0 days.

(21) Appl. No.: 09/782,421

(22) Filed: Feb. 13, 2001

Related U.S. Application Data

(63) Continuation-in-part of application No. 09/249,927, filed on Feb. 12, 1999, now abandoned.

(51) Int. Cl.[7] .................................................. H01B 1/22
(52) U.S. Cl. ...................... 252/512; 252/514; 252/520.1
(58) Field of Search ............................... 252/500, 511, 252/512, 513, 514, 520.1; 156/89.16

(56) References Cited

U.S. PATENT DOCUMENTS

| | | | | |
|---|---|---|---|---|
| 4,282,111 A | * | 8/1981 | Ciuba | 252/178 |
| 4,512,909 A | * | 4/1985 | Schiessl | 252/188.28 |
| 4,569,783 A | * | 2/1986 | Muccitelli | 252/188.28 |
| 4,687,597 A | * | 8/1987 | Siuta | 252/512 |
| 5,336,303 A | * | 8/1994 | Cocks | 106/14.05 |
| 5,376,403 A | | 12/1994 | Capote et al. | |
| 5,463,190 A | | 10/1995 | Carson et al. | |
| 5,542,602 A | | 8/1996 | Gaynes et al. | |
| 5,713,508 A | | 2/1998 | Gaynes et al. | |
| 5,716,663 A | | 2/1998 | Capote et al. | |
| 5,830,389 A | | 11/1998 | Capote et al. | |
| 5,853,622 A | | 12/1998 | Gallagher et al. | |
| 5,922,397 A | | 7/1999 | Brandt et al. | |
| 5,948,533 A | | 9/1999 | Gallagher et al. | |
| 5,951,918 A | * | 9/1999 | Kuwajima et al. | 252/514 |

FOREIGN PATENT DOCUMENTS

| | | | |
|---|---|---|---|
| EP | 343712 | * | 11/1989 |
| EP | 567275 | * | 10/1993 |
| JP | Sho54-(1979)-68489 | | 5/1979 |
| JP | Sho56-(1981)-1528 | | 1/1981 |

OTHER PUBLICATIONS

Lu, Daoqiang: "Isotropic Conductive Adhesives Filled with Low–Melting–Point Alloy Fillers"; IEEE Transactions on Electronics Packaging Manufacturing, vol. 23, No. 3, Jul. 2000.

Lu, Daoqiang: "Development of Conductive Adhesives Filled with Low–melting–point Alloy Fillers"; 2000 Inter. Symposium on Advanced Packaging Materials.

Wong, C.P.: "Recent Advances on Electrically Conductive Adhesives for Electronics Applications"; 2000 IEEE.

* cited by examiner

*Primary Examiner*—Mark Kopec
(74) *Attorney, Agent, or Firm*—Charles W. Almer

(57) ABSTRACT

An composition with improved electrical stability for use in microelectronic applications comprises a polymeric resin, a conductive filler, optionally either a reactive or a nonreactive diluent, optionally an inert filler, and an oxygen scavenger or corrosion inhibitor or both to provide the electrical stability. Alternatively, the composition may also include a low melting point metal filler component.

20 Claims, 4 Drawing Sheets

CONDUCTIVE AND RESISTIVE MATERIALS WITH ELECTRICAL STABILITY FOR USE IN ELECTRONICS DEVICES

This Application is A continuation-in-part of Ser. No. 09/249,927 Feb. 12, 1999 ABN.

FIELD OF THE INVENTION

This invention relates to compositions that are suitable for use as conductive or resistive materials in microelectronic devices or semiconductor packages to provide electrically stable interconnections.

BACKGROUND OF THE INVENTION

Conductive and resistive compositions are used for a variety of purposes in the fabrication and assembly of semiconductor packages and microelectronic devices. For example, conductive adhesives are used to bond integrated circuit chips to substrates (die attach adhesives) or circuit assemblies to printed wire boards (surface mount conductive adhesives), and resistive materials are used to form planar or buried resistors in circuit boards.

Two conductors with dissimilar electrochemical potentials will form an electrochemical cell in the presence of water. The conductors act as cathode and anode, and environmental humidity provides the necessary aqueous medium to bridge the anode and cathode. The metal with the higher electrochemical potential acts as the cathode $\{2H_2O+O_2+4e \rightarrow 4OH^-\}$. The metal with the lower electrochemical potential acts as the anode resulting in the loss of electrons $\{M-ne \rightarrow M^{n+}\}$ and the corrosion of the metal. Oxygen is involved in this mechanism but does not directly react with the anode metal. The metal ion $M^{n+}$ will combine with $OH^-$ and form a metal hydroxide that stabilizes by developing into a metal oxide, which over time forms on the anode surface. Metal oxides in general are non-conductive, the result being a decrease in conductivity of the metal circuitry.

The problem is less acute when the filler in the composition is the same metal as the contiguous circuitry or the substrate. Thus, a semiconductor package using a conductive composition, one comprising an epoxy resin and silver filler, for example, will not be as susceptible to electrochemical failure when a silver-filled composition is used on a silver substrate. However, if the composition is used on a nickel plated substrate, electrochemical corrosion will result under high humidity conditions. If the composition is a resistive composition containing carbon black as the filler, corrosion will become a problem under high humidity conditions if the substrate contains metal with a low electrochemical potential, such as Ni, Cu, and Sn/Pb solder.

It is known in the art that low melting point metal alloys may improve contact resistance, usually when in combination with certain fluxing agents and cured in a specific manner. For example, U.S. Pat. No. 5,830,389, discloses an electrically conductive composition and its method of preparation and use. The composition of this patent includes a high melting point metal, solder, resin, a reactive monomer or polymer and a chemically protected cross-linking agent with fluxing properties. Similarly, U.S. Pat. No. 5,853,622 discloses a conductive adhesive comprising a high melting point metal which is a substantially spherical powder, a low melting point metal which is also a substantially spherical powder, a chemically protected cross-linking agent, resin, reactive monomer or polymer and a metal additive.

These compositions, however, are vulnerable to environmental conditions, and high temperature and high humidity can cause the electrical resistance of the assembly fabricated with these compositions to increase substantially over time. The suspected mode of failure is electrochemical corrosion of the circuitry at the interface of the conductive filler in the composition with another contiguous metal surface, for example, a metal lead frame or other circuitry.

It is also known in the art that specific corrosion inhibitors may be utilized in electroconductive materials. For example, U.S. Pat. No. 5,951,918 discloses an electroconductive powder or paste which comprises a mixture of silvers resulting in a particular aspect ratio. The electroconductive paste of this patent may optionally contain a corrosion inhibitor such as benzothiazole or benzimidazole. However, there is no disclosure in the art of enhanced contact resistance initially and after environmental aging through a combination of a low melting point alloy and a corrosion inhibitor.

It would be an advantage, therefore, to provide conductive and resistive materials that form electrically stable assemblies for use in semiconductor packaging operations. It would also be advantageous to provide a conductive adhesive which would combine a corrosion inhibitor and a low melting point metal or metal alloy in a manner that would provide improved contact resistance when exposed to harsh environmental conditions.

SUMMARY OF THE INVENTION

Figure 1:
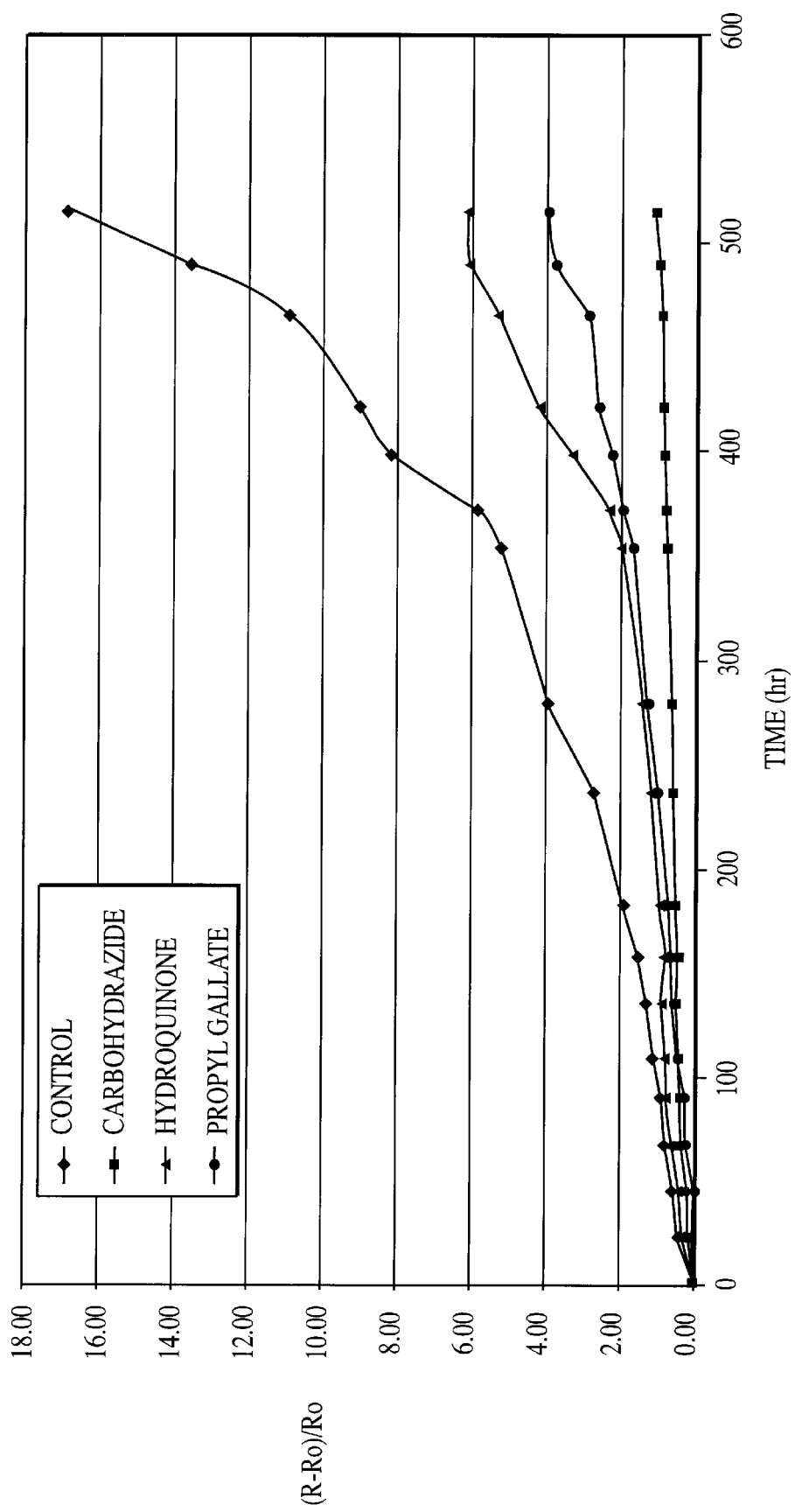
FIG. 1 is a graph of the effect of oxygen scavengers on the contact resistivity of Composition D after exposure to 85° C. and 85% relative humidity for 500 hours.

This invention is a composition that comprises a polymeric resin, a conductive filler, an oxygen scavenger or corrosion inhibitor or both, optionally other additives such as reactive or nonreactive diluents, inert fillers, and adhesion promoters. The compositions exhibit improved electrical stability over those compositions that do not contain an oxygen scavenger or corrosion inhibitor. The oxygen scavengers or corrosion inhibitors will be present in an amount up to 10 weight percent (but not 0%); the resin will be present in an amount of 10 to 90 weight percent; the filler, in an amount of 1 to 90 weight percent; the diluent, in an amount of 0 to 50 weight percent; the inert fillers, in an amount of 0 to 80 weight percent; and the adhesion promoters, in an amount of 0 to 10 weight percent, for a total of 100 weight percent.

In another embodiment, this invention is a method for improving the electrical stability of a composition by adding one or more oxygen scavengers, one or more corrosion inhibitors, or one or more oxygen scavengers and corrosion inhibitors to the composition.

In a further embodiment, the composition includes a low melting point metal filler, such as indium or indium alloys, in combination with a corrosion inhibitor such as 8-hydroxyquinoline.

DETAILED DESCRIPTION OF THE INVENTION

Chemical compositions that may be used in the fabrication of semiconductor packages can be given improved electrical stability by the addition of an oxygen scavenger or corrosion inhibitor or both to the formulation. Although oxygen scavengers and corrosion inhibitors have been used in aqueous medium to inhibit corrosion, it was unexpected that these materials could be added to compositions for use in the electronics industry without any loss in initial conductivity or adhesion properties of these compositions.

A conductive composition achieves its conductivity through metal particles dispersed throughout the composition. When these metal particles are in contact with another contiguous metal, as is required to form the circuitry for the ultimate electronic device, and water is present, an electrochemical cell is formed. The reaction at the cathode utilizes oxygen, and the reaction at the anode eventually produces a metal oxide.

Applicants have discovered that the presence of an oxygen scavenger in the conductive composition to impede the cathodic reaction, or alternatively, the presence of a compound to chelate or react with the metal anode or cathode to interfere with the electrical pathway, will reduce or prevent the electrochemical process and prevent significant increases in resistivity.

An oxygen scavenger is defined herein to be any chemical compound that will react with oxygen to prevent the oxygen from further reaction at the electrochemical cell cathode. Exemplary oxygen scavengers are hydroquinone, carbohydrazide, trihydroxybenzene, aminophenol, hydrazine, pyrogallol, carbohydrazone, polyethyleneamine, cyclohexanedione, hydroxylamine, methoxypropylamine, cyclohexylamine, diethylethanolamine, hydroxyalkylhydroxylamine, tetrasubstituted phenylenediamines, morpholinohexose reductone, ketogluconates, amine bisulfites, lactone derivatives, phenol derivatives, and substituted quinolines.

To counteract the formation of metal oxide, corrosion inhibitors are commonly utilized. A corrosion inhibitor is defined herein to be any chemical compound that has a lone pair of electrons, such as nitrogen-, sulfur-, and oxygen-containing compounds, that will bind with metal and impede the reactivity of the metal at the electrochemical anode. Exemplary corrosion inhibitors are 1,10-phenathiodine, phenothiazine, benzotriazole, benzimidazole, mercaptobenzothiazole, dicyandiamide, 3-isoprolyamino-1-butyne, propargyl quinolinium bromide, 3-benzylamino-1-butyne, dipropargl ether, dipropargyl thioether, propargyl caproate, dianimoheptane, phenathroline, amine, diamine, triamine, hexamethyleneimide, decamethyleneimide, hexamethyleneiminebenzoate, hexamethyleneimine-3,5-dinitrobenzoate, hexamethylenetetramin, d-oximino-b-vinyl quinuclidine, aniline, 6-N-ethyl purine, 1-ethylamino-2-octadecylimidazoline, morpholine, ethanolamine, aminophenol, 8-hydroxyquinoline, pyridine and its derivatives, quinoline and its derivatives, acridine, imidazole and its derivatives, toluidine, mercaptan, thiophenol and its derivates, sulfide, sulfoxide, thiophosphate, and thiourea.

As will be recognized, some oxygen scavengers have corrosion inhibition capability, and some corrosion inhibitors have oxygen scavenger ability.

Exemplary resins for use in these formulations are any of the resins currently used throughout the industry, such as, vinyl, acrylic, phenolic, epoxy, maleimide, polyimide, or silicon-containing resins. The formulations and physical properties are known to those skilled in the art.

Exemplary reactive diluents are glycidyl ethers, for example, 1,4-butanediol diglycidyl ether; vinyl ethers, for example, ethylene vinyl ether, and vinyl esters, for example, ethylene vinyl ester, and acrylates, for example, methyl methacrylate.

An exemplary nonreactive diluents is butyl carbitol.

Exemplary adhesion promoters are silanes and polyvinyl butyrol.

Chemical compositions are used in the fabrication of electronic packages, for example, as adhesives, encapsulants, or to form integral passives, such as resistors or capacitors. By the judicious choice of filler, these compositions can be formulated to give a broad range of resistivity, conductivity, capacitance, or dielectric properties as needed for the specific circuit component. Providing the precise type and amount of filler for obtaining the electrical properties desired for a specific end use application is within the expertise of one skilled in the art. It will be understood that all resistors necessarily exhibit some conductance, and all conductors exhibit some resistance, and that resistors and conductors form a continuum of resistance and conductance depending on the specific property of the individual material. This continuum is also the case for dielectrics and capacitors. A dielectric may function as a true dielectric or isolating component, or as a capacitor, depending on the specific dielectric constant.

Exemplary conductive fillers are silver, copper, gold, palladium, platinum, carbon black, carbon fiber, graphite, aluminum, indium tin oxide, silver coated copper, silver coated aluminum, metallic coated glass spheres and antimony doped tin oxide. Exemplary inert fillers include talc, silica, silicate, aluminum nitride, and mica. Exemplary capacitance/dielectric fillers, which also will be deemed inert fillers herein, are ceramic, barium titanate, and titantium dioxide.

In another embodiment, this invention is a method of enhancing the electrical stability of a conductive or resistive composition comprising adding to the composition an oxygen scavenger or corrosion inhibitor or both.

In a further embodiment of the present invention, conductive chemical compositions can be given improved electrical stability by the addition of a corrosion inhibitor and a low melting point metal filler to the formulation. Although corrosion inhibitors and low melting point metal fillers have been used in the electronics industry in the past it was unexpected that any of these materials could be combined to provide surprisingly improved initial conductivity and conductivity stability over compositions that only included one of these materials.

Applicants have discovered that an adhesive comprising a quinoline derivative, such as 8-hydroxyquinoline, 6-hydroxyquinoline, and 2-hydroxyquinoline, as a corrosion inhibitor compound to chelate or react with the metal anode or cathode, and low melting point metal fillers to increase electrical contacts will reduce or prevent the electrochemical process and prevent significant increases in resistivity.

The adhesive composition of this embodiment of the invention contains up to about 10 weight percent (but not 0%) of a quinoline derivative; up to about 50 weight percent (but not 0%) of a low melting metal filler; about 10 to 90 weight percent of a resin; about 1 to 90 weight percent of a filler; optionally about 0 to 50 weight percent of a diluent; about 0 to 80 weight percent of inert fillers; and about 0 to 10 weight percent of adhesion promoters, for a total of 100 weight percent. Preferably, the quinoline derivative is present in the range of about 1 to 2 weight percent and the low melting point metal filler, such as indium, indium alloys, or certain tin alloys, is present in the range of about 2 to 10 weight percent. Most preferably, the quinoline derivative is present in the range of about 1.4 to 1.8 weight percent and the low melting point metal filler is present in the range of about 4 to 5 weight percent. Preferred quinoline derivatives include 8-hydroxyquinoline, 6-hydroxyquinoline and 2-hydroxyquinoline. Most preferred is 8-hydroxyquinoline.

Preferred low melting point metals and alloys include indium, indium alloys such as indium/silver and indium/tin, and tin alloys, such as bismuth/tin, bismuth/lead/tin and tin/lead.

The invention can be further described by the following examples.

EXAMPLES

Example 1

Three compositions designated A–C were prepared from a phenolic resin and varying amounts of carbon black. The compositions had the following formulations set out in Table 1:

TABLE 1

| Composition A | Composition B | Composition C |
|---|---|---|
| Fillers: | Fillers: | Fillers: |
| 15 g carbon black | 8 g carbon black | 2 g carbon black |
| 21 g talc | 21 g talc | 21 g talc |
| 1 g silica | 1 g silica | 1 g silica |
| Resin: | Resin: | Resin: |
| 54 g phenolic resin | 54 g phenolic resin | 54 g phenolic resin |
| 6 g polyvinyl butyral | 6 g polyvinyl butyral | 6 g polyvinyl butyral |
| Diluent: | Diluent: | Diluent: |
| 15–20 g butyl carbitol | 15–20 g butyl carbitol | 15–20 g butyl carbitol |

The fillers were mixed together by a kneader or planetary mixer. The phenolic resin was a xylene-formaldehyde resin available from Emerson & Cuming; the resin components were mixed together and slowly added with mixing to the fillers. The resulting paste was dispersed and blended with a three roll mill until the paste became uniform. The viscosity was adjusted with butylcarbitol to 0.6 Pa.s at 25° C. as measured by a Brookfield viscometer using a #14 spindle at 5 rpm.

Figure 3:
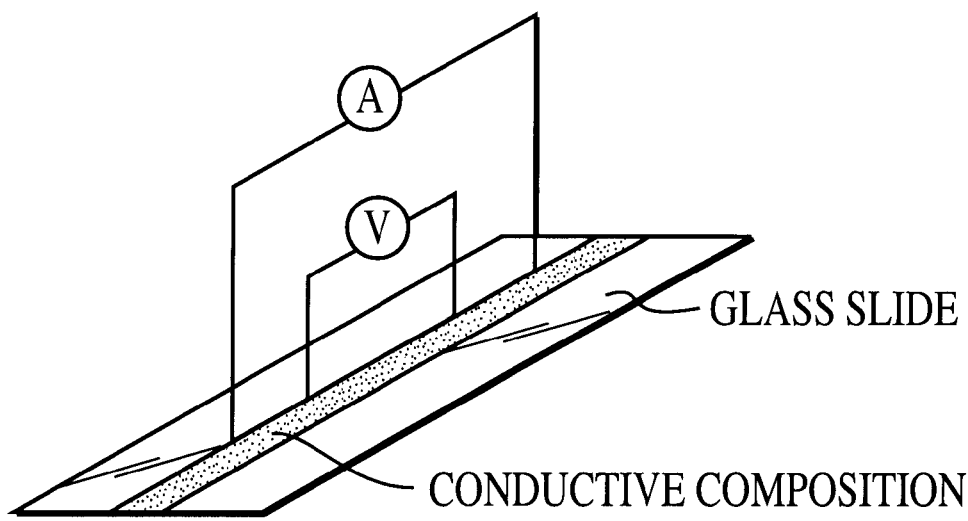
FIG. 3 is a drawing of the test vehicle for bulk resistance.

Composition A was measured for its resistivity without contact with any contiguous metal, denominated its bulk resistivity. The resistivity test vehicle, shown in FIG. 3, consisted of the test composition cured on a glass slide. The composition was dispensed along the length of the slide 76 mm, in an approximate thickness of 20 $\mu$m, and width of 4mm, and then cured for 4 hours at 175° C. After cure, the resistivity was measured using a four probe GenRad 1689 Precision RLC Digibridge. In FIG. 3, A stands for electrical current and V stands for electrical voltage.

The test specimen was then subjected to 85° C. and 85% relative humidity for 500 hours, after which resistivity was again measured. The results indicated only a minor change in resistivity.

Example 2

This example demonstrates the effect of temperature and humidity on the resistivity of Compositions A, B, and C, when contacted with a contiguous metal, denominated contact resistivity.

Figure 4:
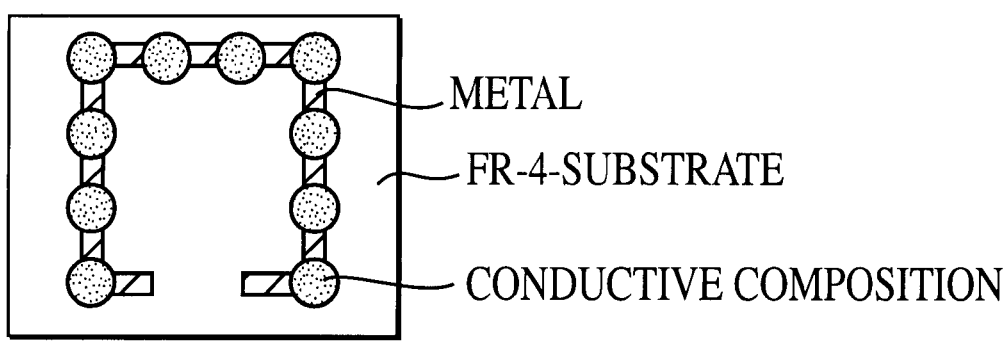
FIG. 4 is a drawing of the test vehicle for contact resistance.

The contact resistivity test vehicle, shown in FIG. 4, consisted of a FR-4 board substrate on which was printed a pattern of an open circuit with metal segments 3 mm long separated by 1 mm gaps in a horseshoe shape. The number of connections between the composition and the metal segments was ten. The compositions were cured for 4 hours at 175° C.

By using multiple metal-adhesive connections in the contact resistance device, the conductivity change can be magnified and the experimental error minimized. Contact resistance was measured across the circuit using a Fluke 45 Dual Display Multimeter and was deemed to be the combination of the resistance as determined by resistivity plus the interfacial resistance between the end of each metal segment and the test composition.

Contact resistance values were determined directly after cooling to room temperature after curing, and monitored over the course of 500 hours while begin subjected to 85° C. and 85% relative humidity.

The percent increase in contact resistivity for the A, B, and C compositions are reported in Table 2.

TABLE 2

Percent Increase in Contact Resistivity for Compositions With No Oxygen Scavenger or Corrosion Inhibitor

| | Contact resistivity | | |
|---|---|---|---|
| | Initial contact | after 85°/85 RH | Percent Increase |
| | resistivity | for 500 hours | in resistivity |
| Composition | Ω/cm | Ω/cm | % |
| A | 100 | 1506 | 1506 |
| B | 1000 | 13720 | 1272 |
| C | 10000 | 54700 | 447 |

To test for the effectiveness of the addition of an oxygen scavenger on resistance stability, each of the Compositions A, B, and C was doped with 7 weight percent hydroquinone. The contact resistivity was tested both before and after conditioning at 85° C./85%RH. The results are reported in Table 3 and show a significant improvement in the electrical stability of the compositions when doped with an oxygen scavenger.

TABLE 3

Compositions with 7 Weight Percent Hydroquinone

| | Contact resistivity | | |
|---|---|---|---|
| | Initial contact | after 85°/85 RH | Percent Increase |
| | resistivity | for 500 hours | in resistivity |
| Composition | Ω/cm | Ω/cm | % |
| A | 90 | 120 | 34 |
| B | 1180 | 3705 | 214 |
| C | 9000 | 19260 | 114 |

Example 3

A series of compositions were prepared from Composition A of Example 1, doped with varying amounts of an oxygen scavenger or corrosion inhibitor. The contact resistivity was measured as in Example 2 both before and after conditioning at 85° C./85% Relative Humidity. The results are reported in Table 4 and show that, with the exception of mercaptobenzothiazole, the presence of the oxygen scavenger or corrosion inhibitor effectively prevents significant increase in resistivity.

TABLE 4

Change in Joint Resistivity

| Composition A | Initial contact resistivity Ω/cm | Contact resistivity after 85/85 Ω/cm | Percent Increase % |
|---|---|---|---|
| with no oxygen scavenger or corrosion inhibitor | 100 | 1506 | 1506 |
| with 2 wt % hydroquinone | 108 | 1016 | 841 |
| with 2 wt % dicyandiamide | 90 | 104 | 15 |
| with 5 wt % dicyandiamide | 112 | 138 | 23 |
| with 2 wt % diaminoheptane | 150 | 1371 | 814 |
| with 5 wt % diaminoheptane | 180 | 295 | 64 |
| with 5 wt % benzimidazole | 80 | 98 | 22 |
| with 5 wt % phenathroline | 87 | 144 | 65 |
| with 5 wt % phenothiazine | 60 | 95 | 59 |
| with 5 wt % benzotriazole | 104 | 531 | 411 |
| with 5 wt % mercaptobenzothiazole | 2662 | 268862 | 10000 |

Example 4

Several compositions suitable for attaching semiconductor dies to lead frames or for attaching semiconductor packages to circuit boards were prepared with oxygen scavengers and corrosion inhibitors and tested for die shear strength. The basic formulation, Composition D, contained 1.0 g of a bisphenol F epoxy resin from Shell Chemical Company, 0.12 g of a urea catalyst, and 4 g silver flakes. The oxygen scavenger or corrosion inhibitor was added in the amount of 0.05 g to this Composition D. An aliquot of the composition was dispensed on a copper substrate, and a 80 mil×80 mil silicon die contacted with the composition with heat (150° C.) for 60 minutes and light pressure. Die shear strength was measured in kg using a Royce system 552 instrument. Eight specimens were tested for each composition and the results pooled and averaged. The results are shown in Table 5. The data show that the addition of an oxygen scavenger does not adversely affect the adhesion properties of the compositions.

TABLE 5

Die Shear Strength

| COMPOSITION D | 12.23 kg |
|---|---|
| with 5% carbohydrazide | 10.65 kg |
| with 5% hydroquinone | 12.83 kg |
| with 5% propyl gallate | 13.36 kg |
| with 5% 8-hydroxyquoline | 14.06 kg |
| with 5% 1,10-phenanthroline | 10.86 kg |

Example 5

The five compositions from Example 4 were tested for change in contact resistivity after 85° C./85% RH conditioning over a period of 500 hours as in the previous examples, except Sn/Pb solder was used instead of copper. Three specimens for each were tested and the results pooled and averaged. The percent increase in resistivity after conditioning is reported in Table 6 for each of the samples. The data show that an oxygen scavenger or corrosion inhibitor can be used to provide electrical stability by preventing increases in resistivity.

TABLE 6

Change in Joint Resistivity

| Composition | Initial contact resistivity Ω/cm | Contact resistivity after 85/85 Ω/cm | Change in contact resistivity Ω/cm |
|---|---|---|---|
| Composition D | 1.85 | 13.06 | 11.21 |
| with 5% carbohydrazide | 0.71 | 1.50 | 0.79 |
| with 5% hydroquinone | 1.09 | 7.87 | 6.78 |
| with 5% propyl gallate | 2.76 | 13.76 | 11.0 |
| with 5 weight % 8-hydroxyquinoline | 0.53 | 1.02 | 0.49 |
| with 5 weight % 1,10-phenanthroline | 0.74 | 2.19 | 1.45 |

Figure 2:
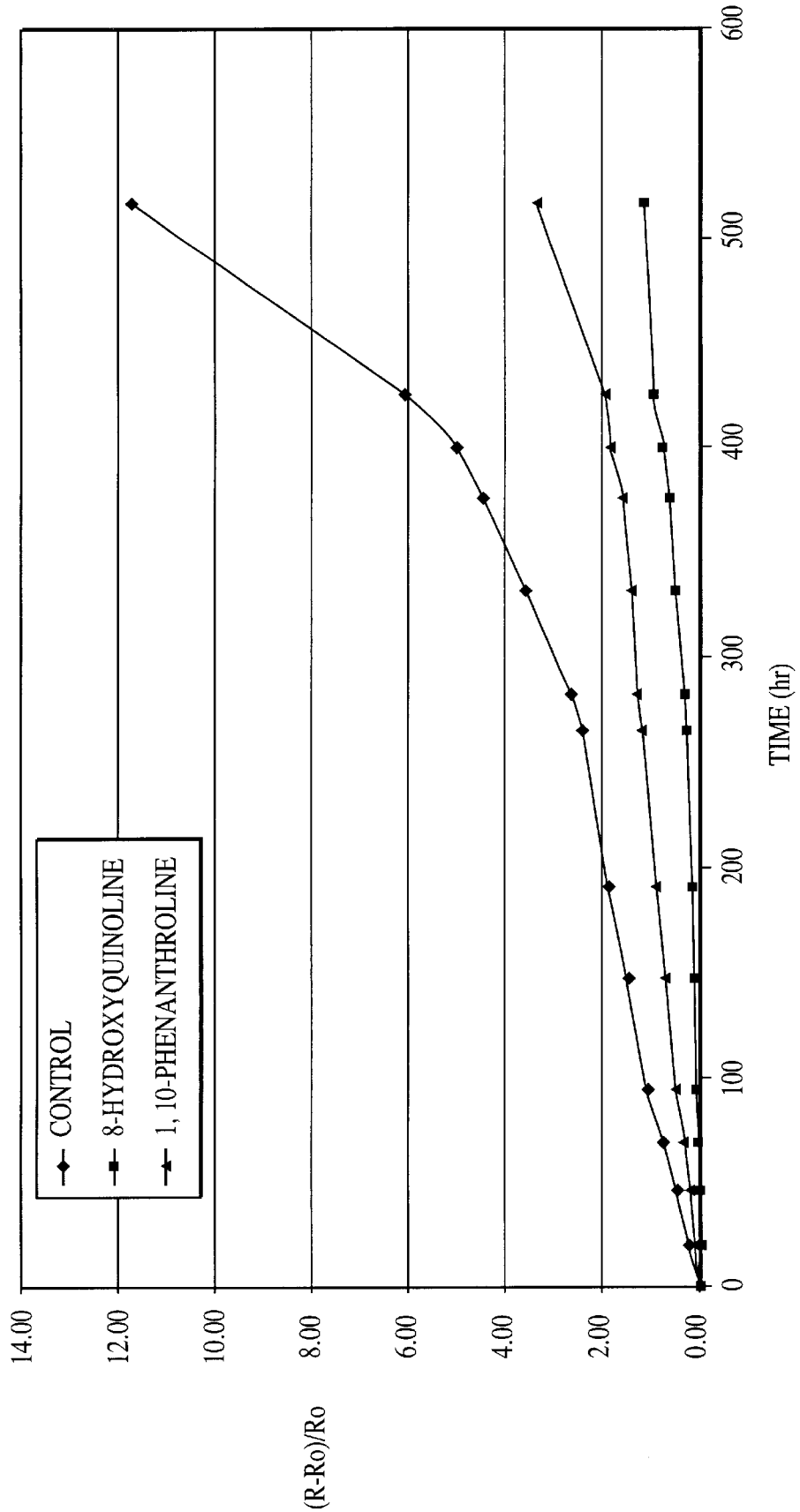
FIG. 2 is a graph of the effect of corrosion inhibitors on the contact resistivity of Composition D after exposure to 85° C. and 85% relative humidity for 500 hours.

The results are also shown in graph format in FIGS. 1 and 2, in which change in resistivity is plotted along the Y-axis and time in hours is plotted along the X-axis. R denotes resistivity during the 85°/85%RH conditioning, $R_o$ denotes initial resistivity before conditioning. FIG. 1 shows the graph for the compositions doped with the oxygen scavenger, and FIG. 2, for the compositions doped with corrosion inhibitors. The graphs show that the doped compositions exhibit a much lower increase in resistivity over time at 85° C./85%RH than the control compositions without any oxygen scavenger or corrosion inhibitor.

Example 6

To test for retention of adhesion in the presence of oxygen scavengers or corrosion inhibitors, samples were prepared from Composition A and doped with varying weight percents of an oxygen scavenger or corrosion inhibitor. The test compositions were prepared for resistivity testing as in Example 1. Initial resistivity along the strip of composition was measured after cure using a GenRad 1689 Precision RLC Digibridge. A strip of Scotch® 810 adhesive tape was placed along the entire length of the pattern of composition on the glass slide with the adhesive contacting the composition. A 1.5 kg weight was rolled over the tape 6 times. The glass slide was secured in a vertical position and an end of the tape pulled from the composition and allowed to hang vertically down from the glass slide. A 500 g weight was attached to the end of the tape and allowed to fall and peel the tape from the glass slide. The resistance was then remeasured.

The same procedure was repeated for compositions deposited on a polyimide film commercially available as Kepton® film from DuPont.

The test compositions and change in resistance are reported in Table 7

TABLE 7

Percentage Change in Resistivity after Peel Test

| COMPOSITION | On glass slide % change | On polyimide film % change |
|---|---|---|
| Composition A | 0.1 | 0.9 |
| with 2 weight % hydroquinone | 0.3 | −0.3 |
| with 7 weight % hydroquinone | 0.4 | −1.1 |
| with 2 weight % dicyandiamide | 0.3 | 0.8 |
| with 5 weight % dicyandiamide | 0.7 | 2623 |
| with 2 weight % diaminoheptane | 0.6 | −1.9 |
| with 5 weight % diaminoheptane | 0.5 | 1.6 |
| with 5 weight % benzimidazole | 0.3 | 174.4 |
| with 5 weight % phenathroline | 0.1 | −1.0 |
| with 5 weight % phenothiazine | 0.0 | 0.2 |
| with 5 weight % benzotriazole | 0.2 | 1815 |

The data show that, except for a few specimens with higher loading on polyimide film, there are only minor changes in resistance after the adhesion test, indicating good retention of adhesion for the compositions containing oxygen scavengers or corrosion inhibitors.

Example 7

A typical composition was prepared by mixing 6 weight percent CTBN rubber modifier, 0.7 weight percent imidazole catalyst, 2 weight percent epoxy functional diluent, 0.3 weight percent adhesion modifier and 10 weight percent low viscosity Bisphenol F epoxy. A desired amount of the corrosion inhibitor 8-hydroxyquinoline was added in the proportion of 0, 1 or 2 weight percent. The composition was prepared by mixing the solids with the liquids and dispersing the composition with a high speed mixer. The resulting mixture was then three roll milled to enhance dispersion of the solids. Next a desired amount of indium was added in the proportion of 0, 4.5, 5, 7.5 or 10 weight percent. Silver was added to complete the mixture. The composition was degased and tested for resistivity at various time periods.

Figure 5:
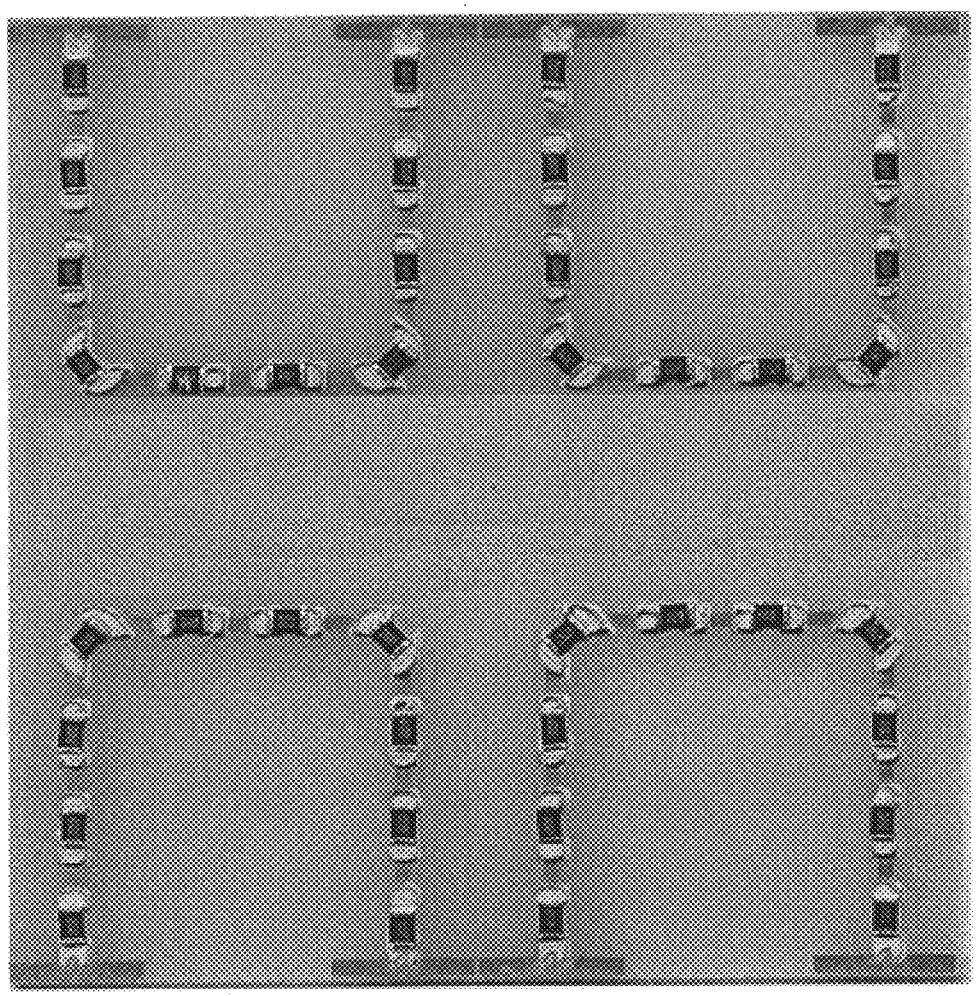
FIG. 5 is an OSP copper FR4 circuit board.

A test device was constructed according to FIG. 5 using the following method for contact resistance testing. The device consisted of a daisy chain OSP copper pattern on an FR4 substrate. The 0.050×0.060 inch copper pads were separated from one another by a 0.050 inch gap. Ten such separations were included in each daisy chain or loop. These gaps in the circuit were connected with various tin/lead or 100% tin terminated chip resistors.

The test boards were constructed by stenciling the adhesives onto metallized pads and bridging the gaps with null ohm resistors to complete the circuit. The test boards were then cured to the recommended cure schedule for each adhesive and initial readings were taken prior to environmental aging at 85% relative humidity and 85° C. Aged readings were then collected at regular intervals up to 1000 hours. These readings were taken after the boards had equilibrated at 25° C. for one hour. The data reported is in resistance per single joint. This is calculated by dividing the overall resistance of the circuit by 20, which is the number of joints in the circuit. The results are shown in Table 8.

TABLE 8

Resistivity of Tin Components With and Without Indium and 8-hydroxyquinoline
Single Joint Contact Resistance for Sn Terminated Components
Environmental Aging Conditions were 85° C. & 85% RH

| | Composition | | Resistance | Resistance | % increase | Resistance | % increase |
|---|---|---|---|---|---|---|---|
| Trial # | Indium | 8HQL | 0 hrs | 420 hrs | 420 hrs | 1572 hrs | 1572 hrs |
| 1 | 10.0 | 1.0 | 7.6 | 9.4 | 24 | 13.3 | 75 |
| 1 | 10.0 | 1.0 | 7.3 | 9 | 23 | 11.8 | 62 |
| 2 | 0.0 | 0.0 | 14.4 | 204 | 1317 | 495.6 | 3342 |
| 2 | 0.0 | 0.0 | 12.3 | 84 | 583 | 243.5 | 1880 |
| 3 | 4.5 | 1.0 | 7.8 | 10.3 | 32 | 10.1 | 29 |
| 3 | 4.5 | 1.0 | 8.0 | 15.6 | 95 | 18.6 | 133 |
| 4 | 10.0 | 0.0 | 33.6 | 1199 | 3468 | 185150 | 550942 |
| 5 | 0.0 | 1.0 | 8.2 | 38.7 | 372 | 80.2 | 878 |
| 6 | 0.0 | 2.0 | 8.5 | 13.2 | 55 | 18.8 | 121 |
| 7 | 9.0 | 2.0 | 7.8 | 10.4 | 33 | 12.6 | 62 |
| 8 | 4.5 | 2.0 | 8.8 | 10.2 | 16 | 12.3 | 40 |
| 10 | 5.0 | 0.0 | 16.8 | 75.5 | 349 | 2119 | 12513 |
| 11 | 7.5 | 1.0 | 7.7 | 10.1 | 31 | 13.9 | 81 |
| Units | Comp. in weight % | | Resistance in milliohms | | % | milliohms | % |

The test results show the superior long-term change in resistivity for tin components using compositions containing both indium and 8-hydroxyquinoline as a corrosion inhibitor. The results show that the absence of either indium or 8-hydroxyquinoline results in a significantly higher resistance.

Example 8

Compositions were prepared as in Example 7 and utilized in conjunction with 90% tin/10% lead and 80% tin/20% lead components. The results are shown in Table 9.

TABLE 9

Resistivity of Tin/Lead Components With and Without Indium and 8-hydroxyquinoline

| | Composition | | Resistance | Resistance | % increase | Resistance | % increase |
|---|---|---|---|---|---|---|---|
| Formula | Corrosion Inhibitor | Indium | 0 hrs | 100 hrs | 100 hrs | 300 hrs | 300 hrs |
| Single Joint Contact Resistance for Sn/Pb 90/10 Terminated Components Environmental Aging Conditions were 85° C. & 85% RH | | | | | | | |
| 118-G | 0.0 | 0.0 | 18.6 | 49.9 | 168 | 81.6 | 339 |

TABLE 9-continued

Resistivity of Tin/Lead Components With and Without Indium and 8-hydroxyquinoline

| Formula | Composition Corrosion Inhibitor | Indium | Resistance 0 hrs | Resistance 100 hrs | % increase 100 hrs | Resistance 300 hrs | % increase 300 hrs |
|---|---|---|---|---|---|---|---|
| 118-A | 1% 8HQL | 0.0 | 11.5 | 21.4 | 86 | 42.2 | 267 |
| 118-D | 1% 8HQL | 5.0 | 10.9 | 17.2 | 58 | 23.2 | 113 |
| Single Joint Contact Resistance for Sn/Pb 90/10 (2) Terminated Components | | | | | | | |
| 118-G | 0.0 | 0.0 | 20.7 | 89 | 330 | 177 | 755 |
| 118-A | 1% 8HQL | 0.0 | 14.8 | 23.4 | 58 | 42 | 184 |
| 118-D | 1% 8HQL | 5.0 | 12.8 | 21 | 64 | 26.4 | 106 |
| Single Joint Contact Resistance for Sn/Pb 80/20 Terminated Components | | | | | | | |
| 118-G | 0.0 | 0.0 | 13.7 | 35.9 | 162 | 687 | 4915 |
| 118-A | 1% 8HQL | 0.0 | 9.9 | 21 | 112 | 35.8 | 262 |
| 118-D | 1% 8HQL | 5.0 | 9.7 | 19.4 | 100 | 26.6 | 174 |
| Units | Comp. in weight % | | Resistance in milliohms | | % | milliohms | % |

The test results show the superior long-term change in resistivity for tin/lead components using compositions containing both indium and 8-hydroxyquinoline as a corrosion inhibitor. The results show that the absence of either indium or 8-hydroxyquinoline results in a significantly higher resistance.

Example 9

A composition was prepared as in Example 7, wherein the indium and/or silver was replaced by silver, an indium alloy or a tin alloy. The alloys are all powders smaller than 325 mesh at 5 weight percent. The corrosion inhibitor was added as desired. The results are shown in Table 10.

TABLE 10

Resistivity of Various Alloys
Single Joint Contact Resistance for Sn Terminated Components
Environmental Aging Conditions were 85° C. & 85% RH

| Formula | Composition Metal/Alloy | 8HQL | Resistance 0 hrs | Resistance 75 hrs | % increase 75 hrs | Resistance 267 hrs | % increase 267 hrs |
|---|---|---|---|---|---|---|---|
| Control | 5% Indium | 1.0 | 9.8 | 11.8 | 20 | 14.3 | 46 |
| | 97In/3Ag | 1.0 | 8.2 | 9.6 | 17 | 12 | 46 |
| | 52In/48Sn | 1.0 | 7.6 | 8.2 | 8 | 9 | 18 |
| | 58Bi/42Sn | 1.0 | 14.2 | 20.5 | 44 | 29.4 | 107 |
| | 46Bi/34Sn/20Pb | 1.0 | 9.2 | 11.3 | 23 | 15.8 | 72 |
| | 63Sn/37Pb | 1.0 | 8.3 | 9.4 | 13 | 12.2 | 47 |
| | 77.2Sn/20In/2.8Ag | 1.0 | 11.0 | 16 | 45 | 25.2 | 129 |
| | (Flaked 46Bi/34Sn/20Pb) | 1.0 | 9.2 | 17.8 | 93 | 41.1 | 347 |
| | (Flaked 58Bi/42Sn) | 1.0 | 7.8 | 13.1 | 68 | 25.4 | 226 |
| Formula | Metal/Alloy | 8HQL | 0 hrs | 90 hrs | 90 hrs | 250 hrs | 250 hrs |
| 4 | 10% Indium | 0.0 | 33.6 | 123.5 | 268 | 474.9 | 1313 |
| 10 | 5% Indium | 0.0 | 16.8 | 30.3 | 80 | 70.2 | 318 |
| 2 | 0.0 | 0.0 | 14.4 | 79 | 449 | 368.2 | 2457 |
| 2 | 0.0 | 0.0 | 12.3 | 33.1 | 169 | 216.4 | 1659 |
| Formula | Metal/Alloy | 8HQL | 0 hrs | 100 hrs | 100 hrs | 268 hrs | 268 hrs |
| 120-A | 63Sn/37Pb | 0.0 | 15.0 | 31.1 | 107 | 53.1 | 254 |
| 120-B | 58Bi/42Sn | 0.0 | 29.1 | 176.9 | 508 | 295 | 914 |
| 120-C | 52In/48Sn (powder mix) | 1.0 | 10.1 | 17 | 68 | 23.4 | 132 |
| Units | Comp. in weight % | | Resistance in milliohms | | % | milliohms | % |

The results shown in Table 10 indicate that preferred low melting point metals for use with 8-hydroxyquinoline as a corrosion inhibitor include indium and alloys of indium/silver, indium/tin, indium/tin/silver, bismuth/tin, bismuth/tin/lead and tin/lead. All of these compositions provide low long-term resistivity increases. In addition, Table 10 also clearly indicates that 8-hydroxyquinoline is necessary to provide the low long-term resistivity increases.

Example 10

Various formulations were prepared as in Example 7. Various corrosion inhibitors were added to the compositions and the results are shown in Table 11.

TABLE 11

Resistivity for Various Corrosion Inhibitors
Single Joint Contact Resistance for Sn Terminated Components
Environmental Aging Conditions were 85° C. & 85% RH

| | Composition | | Resistance | Resistance | % increase | Resistance | % increase |
|---|---|---|---|---|---|---|---|
| Formula | Corrosion Inhibitor | Indium | 0 hrs | 100 hrs | 100 hrs | 460 hrs | 460 hrs |
| 118-G | 0.0 | 0.0 | 9.3 | | | 30.9 | 232 |
| 118-A | 1% 8HQL | 0.0 | 11.0 | 15.3 | 39 | 24.1 | 119 |
| 118-D | 1% 8HQL | 5.0 | 7.5 | | | 14.3 | 91 |
| 118-C | 1% Benzothiazole | 0.0 | 10.3 | 56.2 | 446 | 235.8 | 2189 |
| 118-F | 1% Benzothiazole | 5.0 | 37.5 | | | 576.1 | 1436 |
| Formula | Corrosion Inhibitor | Indium | 0 hrs | 50 hrs | 50 hrs | 488 hrs | 488 hrs |
| 119-D | 1% Benzimidazole | 5.0 | 762.0 | 13308 | 1646 | 183607 | 11052 |
| Formula | Corrosion Inhibitor | Indium | 0 hrs | 100 hrs | 100 hrs | 550 hrs | 550 hrs |
| 120-D | 1% Benzotriazole | 5.0 | 12.1 | 32.6 | 169 | 53.1 | 339 |
| 120-F | 1% Tetrahydroquinoline | 5.0 | 9.8 | 23.6 | 141 | 48.8 | 398 |
| Units | Comp. In weight % | | Resistance in milliohms | | % | milliohms | % |

As shown in Table 11, 8-hydroxyquinoline produces clearly superior results as opposed to the other corrosion inhibitors which were tested. All the compositions containing corrosion inhibitors other than 8-hydroxyquinoline produced significantly higher resistances than the compositions which contain 8-hydroxyquinoline.

What is claimed is:

1. An composition for use in microelectronic devices comprising
   (a) a polymeric resin,
   (b) a conductive filler,
   (c) a corrosion inhibitor,
   (d) optionally, a reactive or a nonreactive diluent,
   (e) optionally, an inert filler, and
   (f) optionally, an adhesion promoter,
   wherein the corrosion inhibitor is 8-hydroxyquinoline.

2. The composition according to claim 1 in which
   (a) the polymeric resin is present in an amount of 10 to 90 weight percent;
   (b) the conductive filler is present in an amount of 1 to 90 weight percent;
   (c) the diluent is present in an amount of 0 to 50 weight percent;
   (d) the inert fillers are present in an amount of 0 to 80 weight percent;
   (e) the 8-hydroxquinoline is present in an amount up to 10 weight percent (but not 0%), and
   the adhesion promoters are present in an amount of 0 to 10 weight percent,
   for a total of 100 weight percent.

3. The composition according to claim 1 in which the resins are selected from the group consisting of vinyl-, acrylic-, phenol-, epoxy-, maleimide-, polyimide-, or silicon-containing resins.

4. The composition according to claim 1 in which the conductive fillers are selected from the group consisting of silver, copper, gold, palladium, platinum, carbon black, carbon fiber, graphite, aluminum, indium tin oxide, silver coated copper, silver coated aluminum, metallic coated glass spheres and antimony doped tin oxide.

5. The composition according to claim 1 in which the diluent is selected from the group consisting of 1,4-butanediol diglycidyl ether and butyl carbitol.

6. The composition according to claim 1 in which the inert filler is selected from the group consisting of talc, silica, silicate, aluminum nitride, mica, ceramic, barium titanate, and titanium dioxide.

7. An adhesive composition for use in microelectronic devices having a tin or tin/lead surface comprising:
   (a) a polymeric resin,
   (b) a conductive filler,
   (c) a corrosion inhibitor,
   (d) a low melting point metal filler,
   (e) optionally, a reactive or a nonreactive diluent,
   (f) optionally, an inert filler, and
   (g) optionally, an adhesion promoter,
   wherein the corrosion inhibitor is 8-hydroxyquinoline and the low melting point metal filler is indium, an indium alloy, a tin alloy or mixtures thereof.

8. The composition according to claim 7 in which
   (a) the polymeric resin is preset in an amount of 10 to 90 weight percent;
   (b) the conductive filler is present in an amount of 1 to 90 weight percent;
   (c) the diluent is present in an amount of 0 to 50 weight percent;

(d) the inert fillers are present in an amount of 0 to 80 weight percent;

(e) the low melting point metal filler is present in an amount up to 50 weight percent (but not 0%);

(f) the 8-hydroxyquinoline is present in an amount up to 10 weight percent (but not 0%), and (g) the adhesion promoters are present in an amount of 0 to 10 weight percent, for a total of 100 weight percent.

9. The composition according to claim 8, wherein the 8-hydroxyquinoline is present in an amount of from about 1 to 2 weight percent.

10. The composition according to claim 9, wherein the 8-hydroxyquinoline is present in an amount of from about 1.4 to 1.8 weight percent.

11. The composition according to claim 7, wherein the low melting point metal is present in the amount of about 2 to 50 weight percent.

12. The composition according to claim 11, wherein the low melting point metal is present in the amount of about 4 to 5 weight percent.

13. The composition according to claim 7, wherein the low melting point metal filler is chosen from the group comprising indium, tin, or alloys of indium or tin with silver, bismuth, lead or mixtures thereof.

14. The composition according to claim 13, wherein the low melting point metal filler comprises indium or an indium alloy.

15. The composition according to claim 13, wherein the low melting point metal filler comprises a substantially spherical powder.

16. The composition according to claim 7 in which the resins are selected from the group consisting of vinyl-, acrylic-, phenol-, epoxy-, maleimide-, polyimide-, or silicon-containing resins.

17. The composition according to claim 7 in which the diluent is selected from the group consisting of 1,4-butanediol diglycidyl ether and butyl carbitol.

18. The composition according to claim 7 in which the inert filler is selected from the group consisting of talc, silica, silicate, aluminum nitride, mica, ceramic, barium titanate, and titanium dioxide.

19. The composition according to claim 7 in which the conductive fillers are selected from the group consisting of silver, copper, gold, palladium, platinum, aluminum, and antimony doped tin oxide.

20. A method of enhancing the electrical stability of a composition comprising adding to the composition a corrosion inhibitor and low melting point metal filler, wherein the corrosion inhibitor is 8-hydroxyquinoline and the low melting point metal filler is indium, an indium alloy, a tin alloy or mixtures thereof.

* * * * *